(12) United States Patent
Kimura (10) Patent No.: US 7,394,029 B2
(45) Date of Patent: Jul. 1, 2008

(54) MODULE, METHOD OF MANUFACTURING MODULE, AND ELECTRONIC APPARATUS USING MODULE

(75) Inventor: Junichi Kimura, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/510,734

(22) Filed: Aug. 28, 2006

(65) Prior Publication Data

US 2007/0049122 A1    Mar. 1, 2007

(30) Foreign Application Priority Data

| Aug. 29, 2005 | (JP) | ............................. 2005-247112 |
| Nov. 16, 2005 | (JP) | ............................. 2005-331063 |
| May 10, 2006  | (JP) | ............................. 2006-131339 |

(51) Int. Cl.
 *H01L 23/495* (2006.01)
(52) U.S. Cl. .................. 174/537; 174/535; 174/548; 174/551; 174/560
(58) Field of Classification Search ................. 174/520, 174/535, 537, 548, 551, 560
See application file for complete search history.

(56) References Cited

U.S. PATENT DOCUMENTS

| 4,658,334 A | * | 4/1987 | McSparran et al. ......... 361/800 |
| 4,661,888 A | * | 4/1987 | Jewell et al. ................ 361/818 |
| 5,252,782 A | * | 10/1993 | Cantrell et al. .............. 174/387 |
| 5,550,713 A | * | 8/1996 | Pressler et al. .............. 361/818 |
| 6,037,846 A | * | 3/2000 | Oberhammer .............. 333/182 |
| 6,194,655 B1 | * | 2/2001 | Lange et al. ................ 174/377 |
| 2004/0256128 A1 | * | 12/2004 | King et al. ................ 174/35 R |
| 2005/0236171 A1 | * | 10/2005 | Garcia ................... 174/35 GC |

FOREIGN PATENT DOCUMENTS

JP       10-290174       10/1998

* cited by examiner

*Primary Examiner*—Hung V. Ngo
(74) *Attorney, Agent, or Firm*—Wenderoth, Lind & Ponack, L.L.P.

(57) ABSTRACT

A module includes a circuit board, a first terminal on a lower surface of the circuit board, a first electronic component on an upper surface of the circuit board, a first cover made of metal covering the first electronic component, a second electronic component on the lower surface of the circuit board, a terminal board provided under the lower surface of the circuit board, a second terminal on an upper surface of the terminal board, a third terminal provided on the lower surface of the terminal board, and a second cover made of metal covering the second electronic component. The second terminal faces the first terminal and is connected to the first terminal. The third terminal is connected to the second terminal. The terminal board has an opening therein surrounding the second electronic component. The second cover includes a top plate portion located under the second electronic component, and a side plate portion extending from the top plate portion toward the lower surface of the circuit board. The side plate portion is positioned between the second electronic component and an inner periphery of the opening. This module occupies a small area.

35 Claims, 9 Drawing Sheets

MODULE, METHOD OF MANUFACTURING MODULE, AND ELECTRONIC APPARATUS USING MODULE

FIELD OF THE INVENTION

The present invention relates to a module including a circuit board and an electronic component mounted on the board, a method of manufacturing the module, and an electronic apparatus using the module.

BACKGROUND OF THE INVENTION

Figure 10:
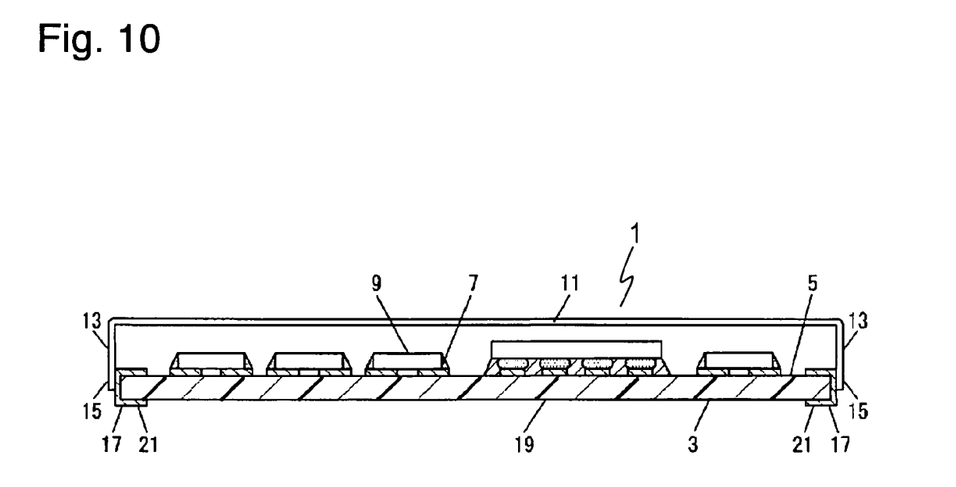
FIG. 10 is a sectional view of a conventional module.

FIG. 10 is a sectional view of conventional module 1. Module 1 includes circuit board 3 and electronic components 9 mounted onto upper surface 5 of circuit board 3 with cream solder 7. Metal cover 11 is placed to cover electronic components 9. Legs 15 provided at sides of cover 11 are connected to notches 17 provided in the rim of circuit board 3 with cream solder. Connection terminals 21 are formed on lower surface 19 of circuit board 3 for connection to a mother board.

Conventional module 1 includes electronic components 9 mounted only on a single surface of the board, hence causing the circuit board to have a large area. Module 1 accordingly occupies a large area of the mother board upon being mounted onto the mother board.

SUMMARY OF THE INVENTION

A module includes a circuit board, a first terminal on a lower surface of the circuit board, a first electronic component on an upper surface of the circuit board, a first cover made of metal covering the first electronic component, a second electronic component on the lower surface of the circuit board, a terminal board provided under the lower surface of the circuit board, a second terminal on an upper surface of the terminal board, a third terminal provided on the lower surface of the terminal board, and a second cover made of metal covering the second electronic component. The second terminal faces the first terminal and is connected to the first terminal. The third terminal is connected to the second terminal. The terminal board has an opening therein surrounding the second electronic component. The second cover includes a top plate portion located under the second electronic component, and a side plate portion extending from the top plate portion toward the lower surface of the circuit board. The side plate portion is positioned between the second electronic component and an inner periphery of the opening.

This module occupies a small area.

DESCRIPTION OF THE PREFERRED EMBODIMENT

Figure 1:
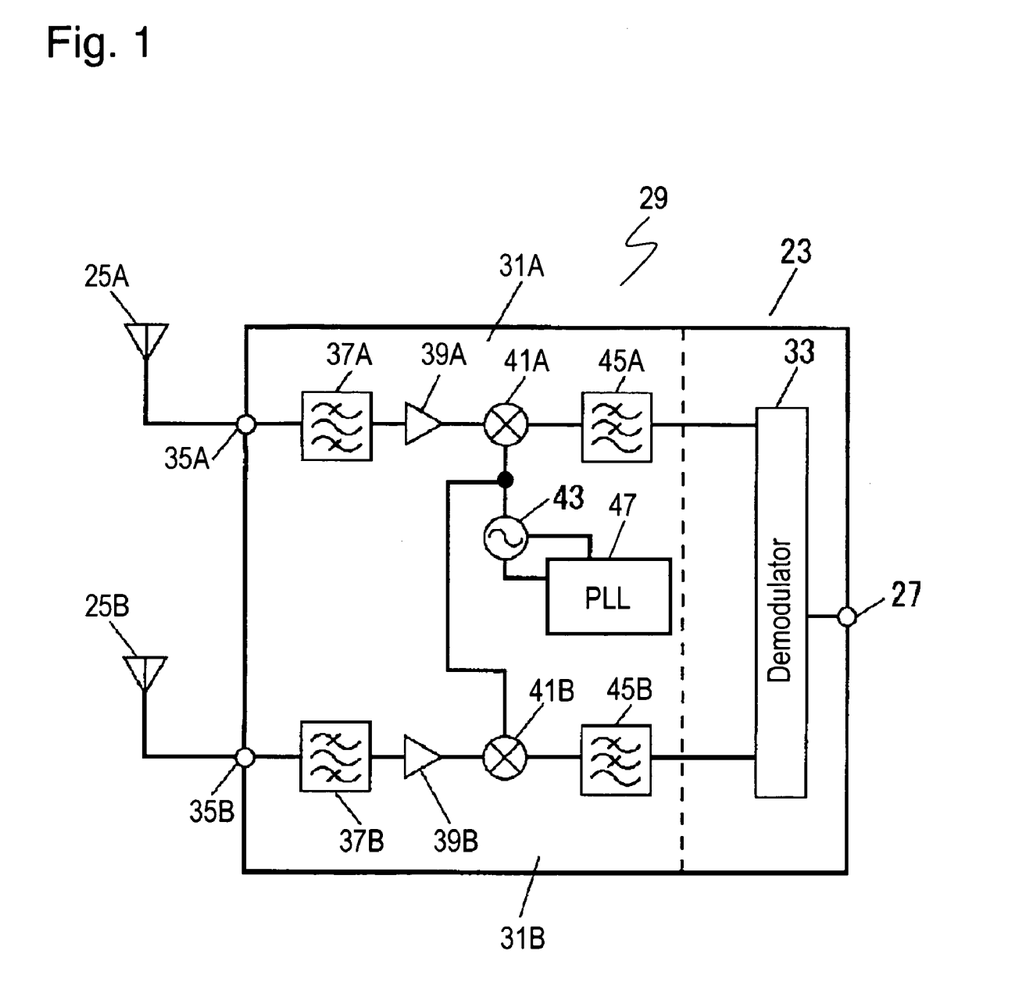
FIG. 1 is a circuit block diagram of a module according to an exemplary embodiment of the present invention.

FIG. 1 is a circuit block diagram of module 23 according to an exemplary embodiment of the present invention. Module 23 provides high-frequency receiver 29 which tunes high frequency signals, such as television broadcasting waves, supplied from antennas 25A and 25B, mixes and demodulates the tuned signals, and outputs them from output terminal 27. High-frequency receiver 29 includes high-frequency circuits, such as electronic tuners 31A and 31B for receiving digital television broadcasting signals and demodulator 33. High-frequency receiver 29 utilizes a diversity method suitable for mobile receivers. The outputs of antennas 25A and 25B are supplied to electronic tuners 31A and 31B, respectively. Demodulator 33 mixes the signals output from electronic tuners 31A and 31B, thus providing high-frequency receiver 29 with an excellent receiving sensitivity for moving.

Electronic tuners 31A and 31B will be described below. High frequency signals input through antennas 25A and 25B are supplied to input terminals 35A and 35B of electronic tuners 31A and 31B, respectively. The high frequency signals supplied to input terminals 35A and 35B are supplied to band-pass filters 37A and 37B, respectively. Band-pass filters 37A and 37B remove unnecessary signals outside of receiving bands from the high frequency signals. Outputs of band-pass filters 37A and 37B are supplied to respective first input ports of mixers 41A and 41B through amplifiers 39A and 39B, respectively. An output of local oscillator 43 is supplied to respective second input ports of mixers 41A and 41B. Mixers 41A and 41B output an I-signal and a Q-signal, respectively. That is, mixers 41A and 41B function as mixers of a direct conversion system. The I-signal and Q-signal output from mixers 41A and 41B are supplied to demodulator 33 through low-pass filters 45A and 45B, respectively. Local oscillator 43 is connected with phase-locked-loop (PLL) circuit 47.

Receiving the outputs of electronic tuners 31A and 31B, demodulator 33 converts the I-signal and Q-signals into digital signals, demodulates, and mixes them. The mixed signal is corrected for errors, and then, output from output terminal 27.

Module 23 is accommodated into a portable apparatus, such as a mobile phone, and adapted for receiving television broadcasting, hence being required to have a small size. A large number of circuits are formed on a mother board in order to provide the mobile apparatus with a lot of functions. Module 23 according to the embodiment can occupy a small surface area of the mother board on which the module is mounted. Module 23 according to this embodiment is a tuner for receiving digital television broadcasting, but may be used as a tuner for receiving analog signal broadcasting or as a module for transmitting and receiving signals used in other types of telecommunications devices.

Figure 2A:
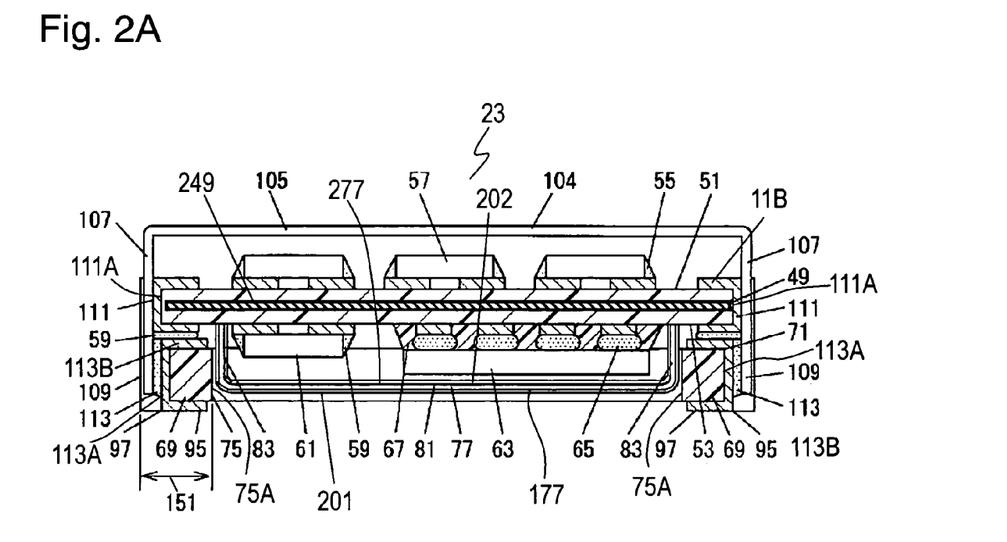
FIG. 2A and FIG. 2B are sectional views of the module according to the embodiment.
Figure 2B:
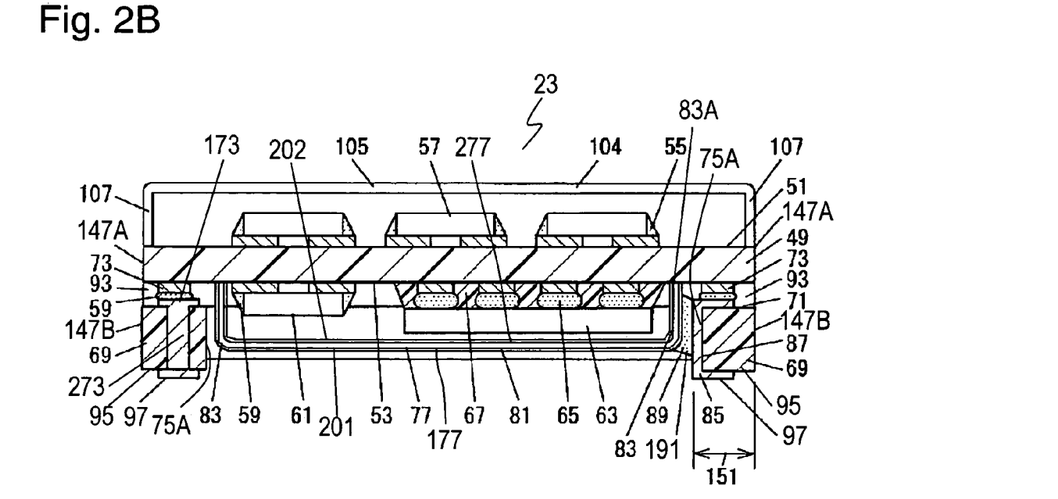

A structure of module 23 including the high frequency circuit will be described below. FIGS. 2A and 2B are sectional views of module 23. Tuner 31A is formed on upper surface 51 of circuit board 49 made of a multi-layered substrate having six layers, and electronic tuner 31B and demodulator 33 are formed on lower surface 53 of board 49. Electronic component 57 composing a circuit of electronic tuner 31A is mounted onto upper surface 51 of circuit board 49 with cream solder 55. Electronic component 61 composing electronic tuner 31B and demodulator 33 are mounted onto lower surface 53 with cream solder 59.

Integrated circuit (IC) element 63 is flip-chip mounted onto lower surface 53 of circuit board 49 with solder bumps 65 to be electrically connected with circuit board 49. Epoxy resin 67 injected into a space between IC element 63 and circuit board 49 bonds IC element 63 to circuit board 49.

Terminal board 69 having a frame shape is attached under lower surface 53 of circuit board 49. Connection terminal 73 is formed on lower surface 53 of circuit board 49. Connection terminal 173 is formed on upper surface 71 of terminal board 69 facing connection terminal 73. Connection terminal 173 is connected to connection terminal 73 with cream solder 59, a bonding material. That is, upper surface 71 of terminal board 69 faces lower surface 53 of circuit board 49, and terminal board 69 is placed under lower surface 53 of circuit board 49.

Terminal board 69 having the frame shape has opening 75 formed in the center thereof. Cover 77 made of metal is provided in opening 75. Opening 75 penetrates from upper surface 71 to lower surface 95 of terminal board 69. Cover 77 has top plate portion 81 covering electronic component 61 and side plate portion 83 formed by bending an edge of top plate portion 81. Terminal board 69 has notch 85 in inner periphery 75A of opening 75. Connection conductor 87 is formed on notch 85. Gap 89 is formed between connection conductors 87 and side plate portions 83 of cover 77. Cream solder 191, the bonding material, is injected in gaps 89 as to connect cover 77 with terminal board 69.

Edge 83A of side plate portions 83 preferably contacts lower surface 53 of circuit board 49. This structure prevents cream solder 191 from entering into an inside of cover 77 by flowing between edge 83A of side plate portion 83 and lower surface 53 of circuit board 49, thereby preventing cream solder 191 from causing a short circuit between cover 77 and electronic component 61. Side plate portion 83 shields gap 93 between lower surface 53 of circuit board 49 and upper surface 71 of terminal board 69, thereby preventing high-frequency signals of electronic tuner 31B and demodulator 33 which are formed on lower surface 53 of circuit board 49 from leaking through gap 93.

Top plate portion 81 of cover 77 is located under electronic component 61. Side plate portion 83 of cover 77 extends from top plate portion 81 toward lower surface 53 of circuit board 49, and is positioned between electronic component 61 and inner periphery 75A of opening 75.

Figure 2C:
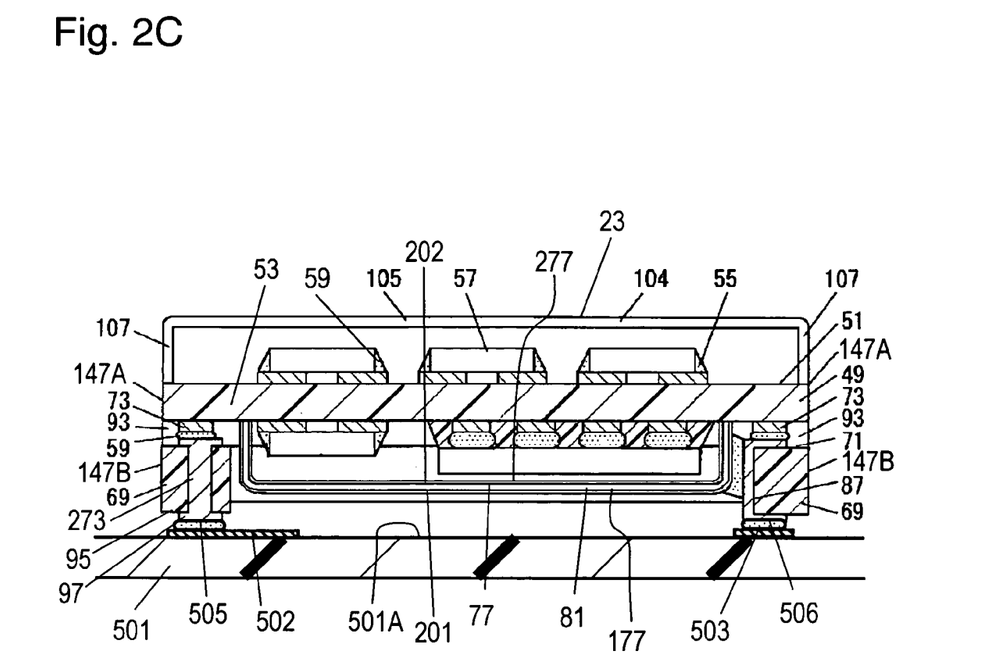
FIG. 2C is a sectional view of the module mounted onto a mother board according to the embodiment.

Circuit board 49 has grounding layer 249 therein. Top plate portion 81 and side plate portions 83 of cover 77 and grounding layer 249 surround electronic component 61 and IC element 63, hence providing module 23 preventing leakage of the high frequency signals, FIG. 2C is a sectional view of module 23 mounted on mother board 501. Mother board 501 has conductor patterns 502 and 503 formed on upper surface 501A of mother board 501. Mounting terminal 97 is provided on lower surface 95 of terminal board 69, and is fixed and connected to conductor pattern 502 with solder 505. Lower surface 95 protrudes beyond top plate portion 81 of cover 77. This prevents cover 77 from short-circuiting with conductor pattern 502 on mother board 501 while module 23 is mounted onto mother board 501. Mounting terminal 97 is connected to connection terminal 73 via through-hole 273 provided in terminal board 69. Solder 59, 91 and 191 have melting points higher than a melting point of solder 505 for bonding module 23 to mother board 501. This prevents solder 59, 91 and 191 from melting again when module 23 is bonded to mother board 501, thereby preventing short-circuiting.

Insulation film 201 is formed on outer surface 177 of cover 77. This film can reduce a height of lower surface 95 protruding beyond outer surface 177 of cover 77, thus reducing an overall height of module 23 while preventing cover 77 from short-circuiting with conductor pattern 502.

Insulation film 202 is formed on inner surface 277 of cover 77. This film can reduce the distance between electronic component 61 and cover 77 as well as the distance between IC element 63 and cover 77, thus further reducing the height of module 23. Insulation films 201 and 202 are made of polyimide resin film. Polyimide film has a stretch property, and is accordingly not peeled off easily even at the border between top plate portion 81 and side plate portions 83 of cover 77.

Cover 104 is placed on upper surface 51 of circuit board 49 to cover electronic component 57. Cover 104 has top plate portion 105, side plate portions 107 formed by bending a portion of top plate portion 105, and legs 109 extending from an edge of side plate portion 107. Circuit board 49 has notch 111 along an outer periphery thereof for insertion of legs 109. Terminal board 69 has notch 113 at a position corresponding to notch 111 of circuit board 49 and has a size larger than that of notch 111. The differences of diameters and widths between notch 113 and 111 are preferably not smaller than a dimensional deviation of terminal board 69 mounted to circuit board 49. This arrangement prevents side surface 113A of notch 113 from protruding outside of side surface 111A of notch 111, hence allowing legs 109 to be inserted easily into circuit board 49.

Conductor 111B is provided on notch 111 from upper surface 51 to lower surface 53 across side surface 111A of circuit board 49. Conductor 113B is provided on notch 113 from upper surface 71 to lower surface 95 across side surface 113A of terminal board 69. Legs 109 of cover 104 are fixed and connected to conductors 111B and 113B with cream solder 91, a bonding material. Conductors 111B and 113B are used as grounding terminals of electronic tuners 31A and 31B and demodulator 33. Cover 104 provides a grounding path of the high frequency circuits on circuit board 49, thus providing a shielding effect to the high frequency circuits.

In module 23 of this embodiment, the high frequency circuits are formed on both surfaces of circuit board 49 since terminal board 69 has opening 75 in which electronic component 61 is mountable. This structure reduces an overall area of circuit board 49, thereby reducing a surface area occupied by module 23 on mother board 501.

In module 23, side plate portions 83 of cover 81 are inserted between electronic component 61 and terminal board 69. This structure prevents signals of electronic tuner 31B and demodulator 33 mounted on lower surface 53 from leaking to circuits on mother board 501 via mounting terminal 97, thereby allowing the high frequency circuits to be mounted onto lower surface 53 of circuit board 49. This structure reduces the overall area of circuit board 49, thereby reducing the surface area occupied by module 23 on mother board 501. Cover 77 shields electronic tuner 31 and demodulator 33, thereby providing module 23 with a high resistance to interference.

Figure 3:
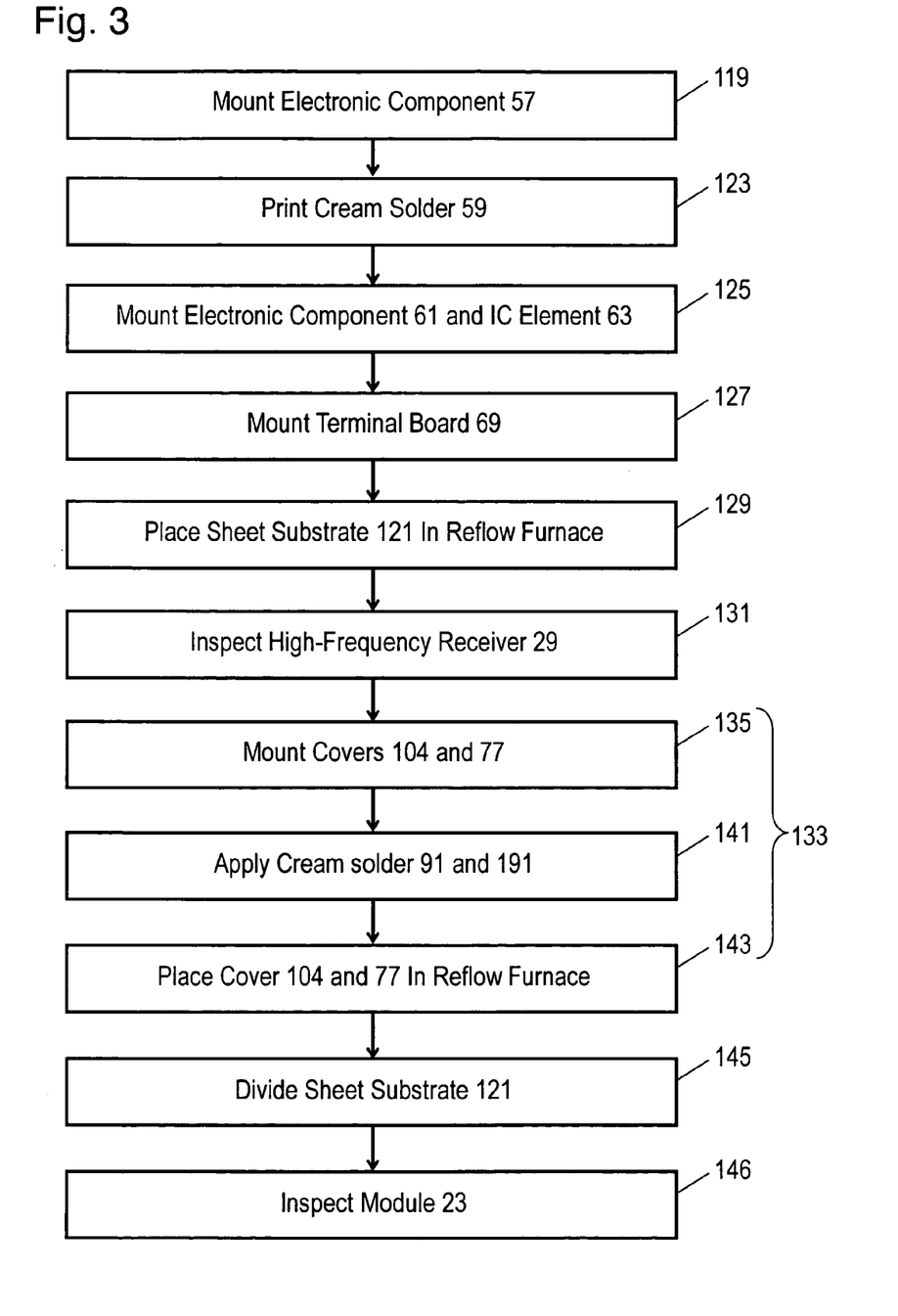
FIG. 3 is a flow chart of processes of manufacturing the module according to the embodiment.

FIG. 3 is a flow chart of processes of manufacturing module 23. A method of manufacturing module 23 will be described with reference to the processes shown in FIG. 3.

Figure 4:
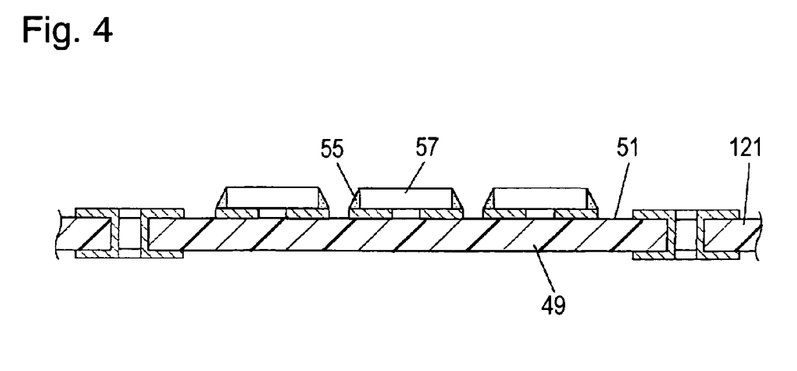
FIG. 4 is a sectional view of the module for illustrating a manufacturing process according to the embodiment.

Electronic component 57 is mounted at step 119 shown in FIG. 3. FIG. 4 is a sectional view of module 23 at step 119.

Electronic component 57 is mounted onto upper surface 51 of sheet substrate 121 including plural circuit boards 49 joined to each other. Cream solder 55 is printed in advance on upper surface 51 of sheet substrate 121 (circuit board 49) by, for example, screen printing, and electronic component 57 is mounted on upper surface 51 to reflow-solder electronic component 57. Electronic component 57 may be a chip component and a packaged semiconductor device. Sheet substrate 121 includes nine circuit boards 49 jointed to each other in which three boards are arranged in each of a column and row.

Figure 5:
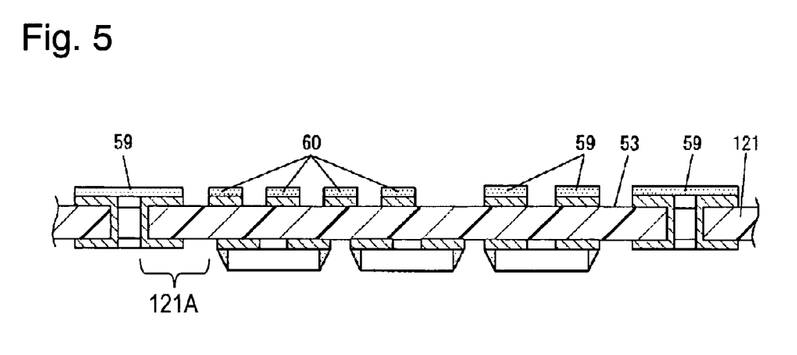
FIG. 5 is a sectional view of the module for illustrating a manufacturing process according to the embodiment.

Cream solder 59 and flux 60 are printed on sheet substrate 121 at step 123 shown in FIG. 3. FIG. 5 is a sectional view of module 23 at step 123. Cream solder 59 and flux 60 are printed on lower surface 53 of sheet substrate 121 (circuit boards 49) by screen printing at step 123 after step 119. Then, a chip component, such as electronic component 61, and IC element 63 are mounted on portions of lower surface 53 of sheet substrate 121 (circuit boards 49) other than areas near the outer peripheries of circuit boards 49 at step 125 shown in FIG. 3. That is, mount-free area 121A in which no electronic component 61 and no IC element 63 is mounted is provided on lower surface 53 around the outer peripheries of circuit board 49.

Figure 6:
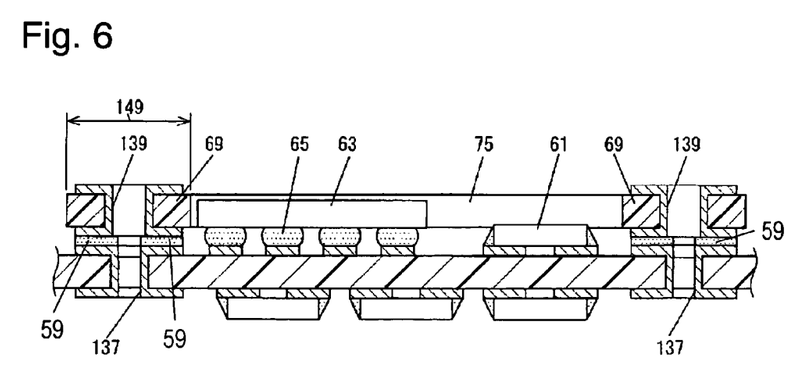
FIG. 6 is a sectional view of the module for illustrating a manufacturing process according to the embodiment.

Terminal board 69 is mounted to sheet substrate 121 (circuit board 49) at step 127. FIG. 6 is a sectional view of module 23 at step 127. Terminal board 69 is mounted onto mount-free area 121A of lower surface 53 of sheet substrate 121 after step 125. Electronic component 61 and IC element 63 are located inside of opening 75 of terminal board 69, and are surrounded by opening 75, i.e., terminal board 69. Through-hole 139 formed in terminal board 69 has a diameter larger than that of through-hole 137 formed in sheet substrate 121. Through-hole 139 provided in terminal board 69 is located above through-hole 137 provided in sheet substrate 121.

Sheet substrate 121 having electronic component 61, IC element 63, and terminal board 69 mounted thereon is placed in a reflow furnace at step 129. Electronic component 61, IC element 63, and terminal board 69 are reflow-soldered to sheet substrate 121 with cream solder 59 and solder bump 65, providing circuits of high frequency receiver 29 on each of circuit boards 49.

Figure 7:
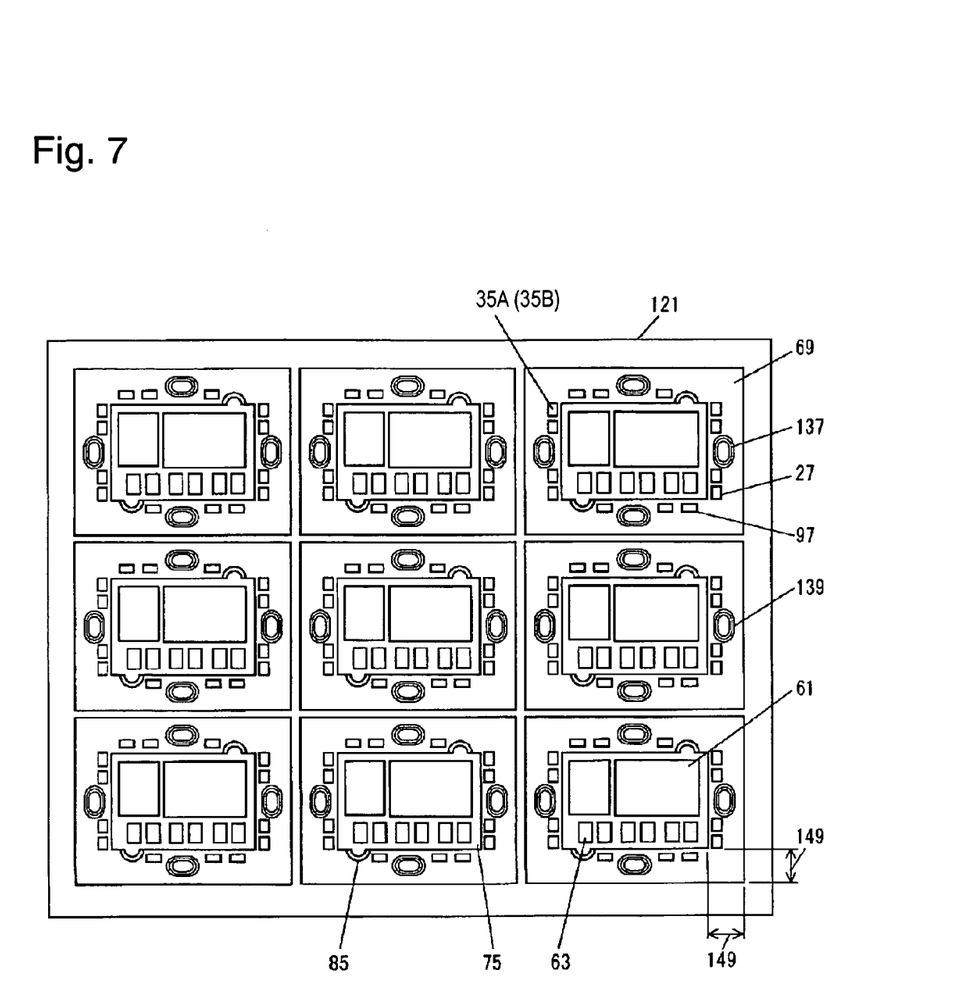
FIG. 7 is a sectional view of the module for illustrating a manufacturing process according to the embodiment.

High-frequency receiver 29 is inspected at step 131 after step 129 to determine whether the circuits operate normally or not. FIG. 7 is a bottom view of modules 23 at step 131. In this step 131, test pins contact terminals 97 on terminal board 69, and a predetermined voltage is applied to high frequency receiver 29 to operate the circuits. The inspection is carried out by supplying a test signal from input terminal 35 to determine whether or not a predetermined output signal is output from output terminal 27. This inspection determines presence or absence of any soldering defect. Sheet substrate 121 includes nine modules 23, accordingly being inspected efficiently.

Figure 8A:
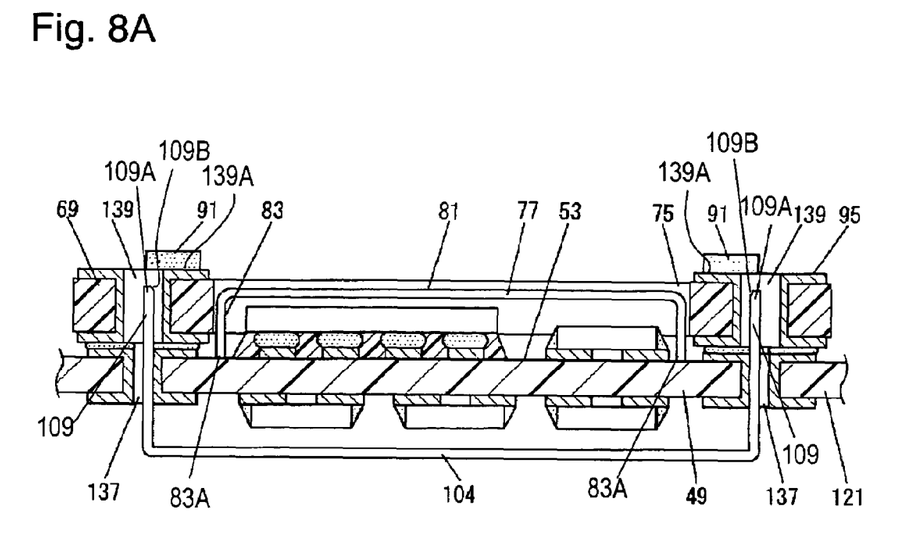
FIGS. 8A and 8B are sectional views of the module for illustrating manufacturing processes according to the embodiment.
Figure 8B:
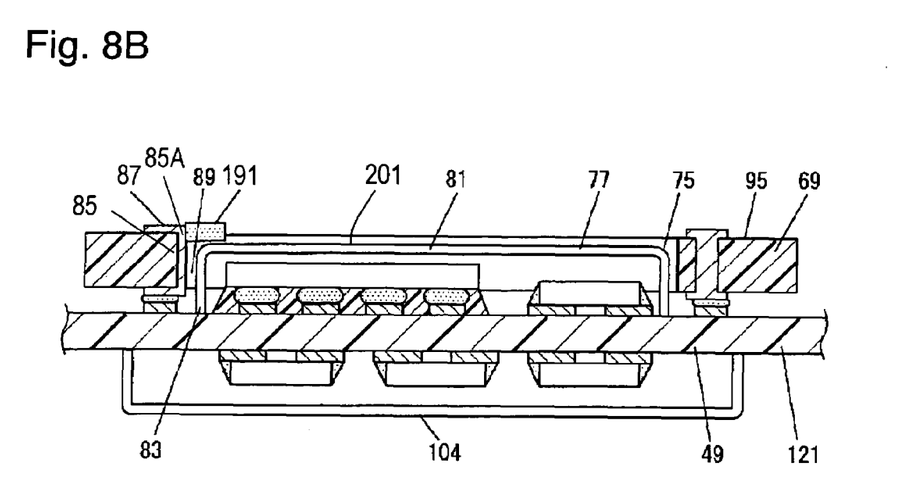

FIGS. 8A and 8B are sectional views of module 23 at step 133 shown in FIG. 3. Step 133 includes steps 135, 141, and 143, as shown in FIG. 3. At step 135, covers 104 and 77 are mounted to module 23 having high frequency receiver 29 which has been judged to operate normally at step 131. Legs 109 of cover 104 enter into through-holes 137 in sheet substrate 121, and reach through-holes 139 of terminal board 69. Legs 109 are inserted in through-holes 137 with a pressure, and are retained by through-holes 137.

Cover 77 is mounted to lower surface 53 of sheet substrate 121 (circuit board 49) through opening 75 of terminal board 69. Edge 83A of side plate portion 83 of cover 77 contacts lower surface 53 as to produce no gap between edge 83A and lower surface 53. This structure prevents signals in electronic tuner 31B and demodulator 33 formed on lower surface 53 from leaking and causing interference to other circuits, such as an oscillation circuit of a mobile phone, and prevents signals of the other circuits from entering into electronic tuners 31A and 31B and demodulator 33.

At step 141 shown in FIG. 3, cream solders 91 and 191 are applied onto terminal board 69 and cover 77 simultaneously from under lower surface 95 by screen printing. During this step, cream solder 91 is applied onto portion 139A of lower surface 95 around through-holes 139 in order to fix and connect cover 104 to through-holes 139, as shown in FIG. 8A. Cream solder 91 is applied from portion 85A on lower surface 95 of notches 85 to top plate portion 81 of cover 77 in order to solder cover 77 to terminal board 69, as shown in FIG. 8B.

Then, at step 143, sheet substrate 121 is heated in a reflow furnace while cream solder 191 faces upward. This heating causes the cream solder 91 to flow into gaps between legs 109 and through-holes 137 as well as gaps between legs 109 and through-holes 139, thereby fixing and connecting legs 109 to both of sheet substrate 121 and terminal board 69. Cream solder 191 flows into gaps 89 so as to fix and connect side plate portions 83 of cover 77 to connection conductors 87. Insulation film 201 provided on top plate portion 81 of cover 77 prevents cream solder 191 from producing a bump on top plate portion 81, and allows cream solder 191 to flow reliably into gaps 89. Covers 104 and 77 are efficiently soldered to sheet substrate 121 (circuit board 49) and terminal board 69 simultaneously in the reflow furnace. Cream solder 59 has a melting point higher than that of cream solders 91 and 191 in order to have cream solder 91 and 191 solder sheet substrate 121 having the electronic components soldered thereon with cream solder 59.

Before legs 109 of cover 104 are inserted into through-holes 137 of sheet substrate 121, an inner distance between legs 109 is smaller than a distance between through-holes 137. This arrangement causes cover 104 to be retained in through-holes 137 after legs 109 are inserted with a pressure. This prevents cover 104 from dropping off even when sheet substrate 121 is placed in the reflow furnace with cover 104 facing downward at step 143. Inner sides 109B of edges 109A of legs 109 facing circuit board 49 are chamfered as to allow legs 109 to be inserted easily into through-holes 137.

At step 145 of FIG. 3, sheet substrate 121 is divided into modules 23. After this dividing, modules 23 are inspected in their performances at step 146, thus completing modules 23. According to the embodiment, at step 145, sheet substrate 121 is cut at predetermined intervals with a spinning diamond cutter blade to divide substrate 121 into nine modules 23. This cutting provides cut surfaces 147A and 147B at respective sides of circuit board 49 and terminal board 69, as shown in FIGS. 2A and 2B. Both of sheet substrate 121 and terminal board 69 are cut simultaneously with the diamond cutter blade, thereby having cut surfaces 147A and 147B be flush with each other and thus being cut to have substantially the same sizes and the same shapes. At this moment, through-holes 139 and 137 are cut as to form notch 113 in terminal board 69 and to form notch 111 in circuit board 49.

Terminal board 69 and sheet substrate 121 are cut simultaneously, hence having large width 149 enabling terminal board 69 to be stuck easily and to be efficiently mounted on sheet substrate 121 with an automatic mounting machine at step 127. Terminal board 69 is cut together with circuit board 49 after they are soldered, thereby having no crack even if board 69 is cut to small width 151 as shown in FIGS. 2A and 2B. Width 151 of terminal board 69 may be small, thus reducing an overall area of circuit board 49 and reducing the surface area occupied by module 23 on mother board 501.

According to the embodiment, at step 145, the diamond cutter blade spins to cut terminal board 69 and sheet substrate 121 at a distance of 0.2 mm away from an outer surface of cover 104.

According to this embodiment, terminal board 69 and sheet substrate 121 are cut at step 145 after covers 77 and 104 are soldered at step 133. According to this embodiment, terminal board 69 and sheet substrate 121 may be cut after terminal board 69 is soldered to sheet substrate 121 at step 129 and before covers 77 and 104 are soldered. This procedure prevents cover 104 from being scratched at step 145.

According to this embodiment, the diameter of through-hole 139 forming notch 111 in circuit board 49 is larger than that of through-hole 137 forming notch 113 in terminal board 69. The diameter of through-hole 139 forming notch 111 in circuit board 49 may be smaller than that of through-hole 137 forming notch 113 in terminal board 69. This enables legs 109 of cover 104 to be easily inserted, hence allowing cover 104 to be mounted onto terminal board 69 with an automated machine.

Module 23 according to this embodiment has circuit board 49 and terminal board 69 with their cut surfaces 147A and 147B flush with each other without unevenness, hence having accurate dimensions. Since having the accurate dimensions, module 23 can reduce the distance between module 23 and components adjacent to module 23 on mother board 501. This allows the components to be mounted densely on mother board 501, accordingly reducing the size of mother board 501.

Covers 104 and 77 are soldered in the reflow furnace, but may be soldered by local heating. In this case, positions to be soldered are locally heated, hence reducing the number of times electronic components 57 and 61 and IC element 63 are heated. This allows electronic components weak against heat to be used, thus increasing the selection of electronic components including inexpensive components.

Figure 9A:
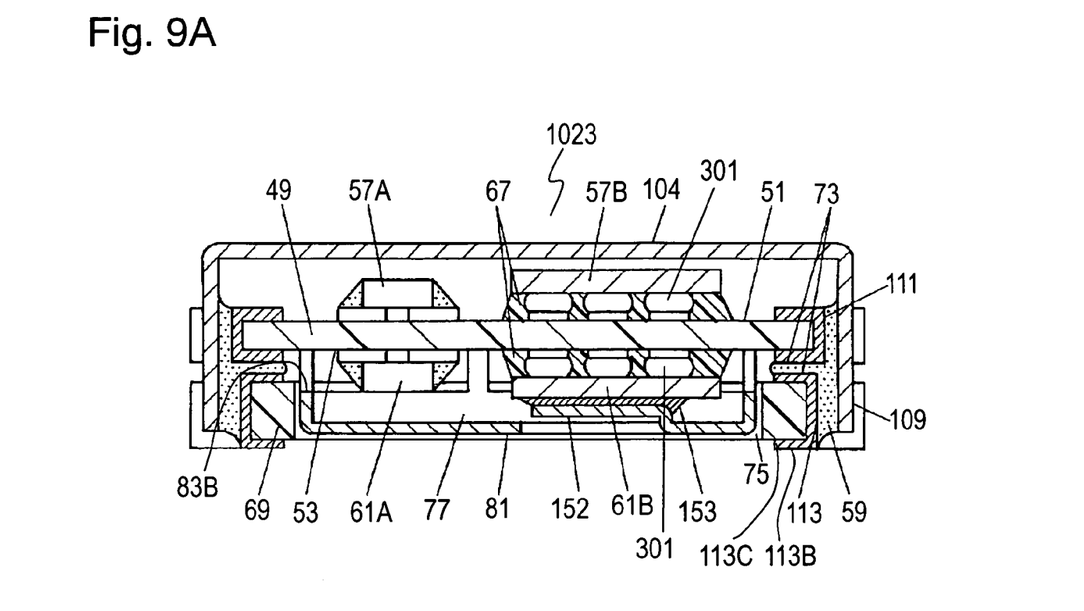
FIGS. 9A and 9B are sectional views of another module according to the embodiment.
Figure 9B:
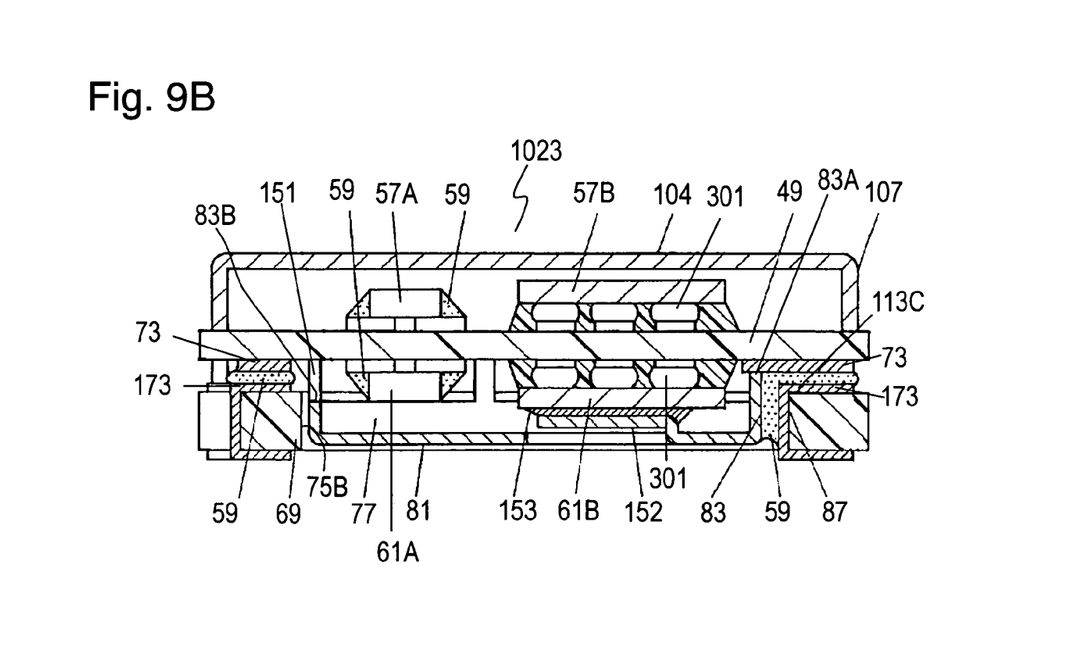

FIGS. 9A and 9B are sectional views of another module 1023 according to this embodiment. In FIGS. 9A and 9B, some of the components are the same as those shown in FIGS. 2A and 2B, and their description will be omitted. In FIGS. 9A and 9B, electronic tuner 31A is formed on upper surface 51 of circuit board 49, and electronic tuner 31B and demodulator 33 are formed on lower surface 53. That is, electronic components 57, such as chip component 57A and IC element 57B, forming electronic tuner 31A are mounted on upper surface 51 of circuit board 49. Electronic components, such as chip component 61A and IC element 61B, forming electronic tuner 31B and demodulator 33 are mounted on lower surface 53. Chip components 57A and 61A forming these circuits are mounted onto circuit board 49 with solder 59. IC elements 57B and 61B are mounted onto circuit board 49 by flip-chip mounting. IC elements 57B and 61B are electrically connected to circuit board 49 via solder bumps 301. Epoxy resin 67 is injected into spaces between IC element 57B and circuit board 49 and between IC element 61B and circuit board 49 so as to securely bond IC elements 57B and 61B onto circuit board 49.

Solder 59 is supplied into a space provided between connection conductors 87 and side plate portions 83 of cover 77 so as to bond cover 77 to terminal board 69.

Solder 59 is applied between terminal board 69 and circuit board 49, hence providing a gap at portion 75B where connection terminal 73 is not provided. Gap 151 is provided between edge 83B of side plate portion 83 and lower surface 53 of circuit board 49. Gap 151 allows air to flow through a space surrounded by circuit board 49 and cover 77, thereby increasing the effect of heat dissipation. Edge 83A of side plate portion 83 contacts lower surface 53 of circuit board 49 at an area where connection conductor 87 is provided. This structure prevents solder 59 from flowing into the inside of cover 77 between edge 83A of side plate portion 83 and lower surface 53 of circuit board 49, thereby preventing solder 53 from causing a short circuit between cover 77 and chip component 61A or IC element 61B. Side plate portion 83 shields between lower surface 53 of circuit board 49 and upper surface 71 of terminal board 69, thereby preventing high-frequency signals in electronic tuner 31B and demodulator 33 on lower surface 53 of circuit board 49 from leaking to the outside.

Cover 77 has projection 152 projecting toward IC element 61B. Projection 152 is formed by cutting and folding a portion of top plate portion 81 of cover 77, and contacts IC element 61B. Grease 153, a heat conductive material, is applied between projection 152 and IC element 61B. Projection 152 is formed by cutting and folding and has flexibility, hence absorbing a deviation of the height of IC element 61B.

Figure 9C:
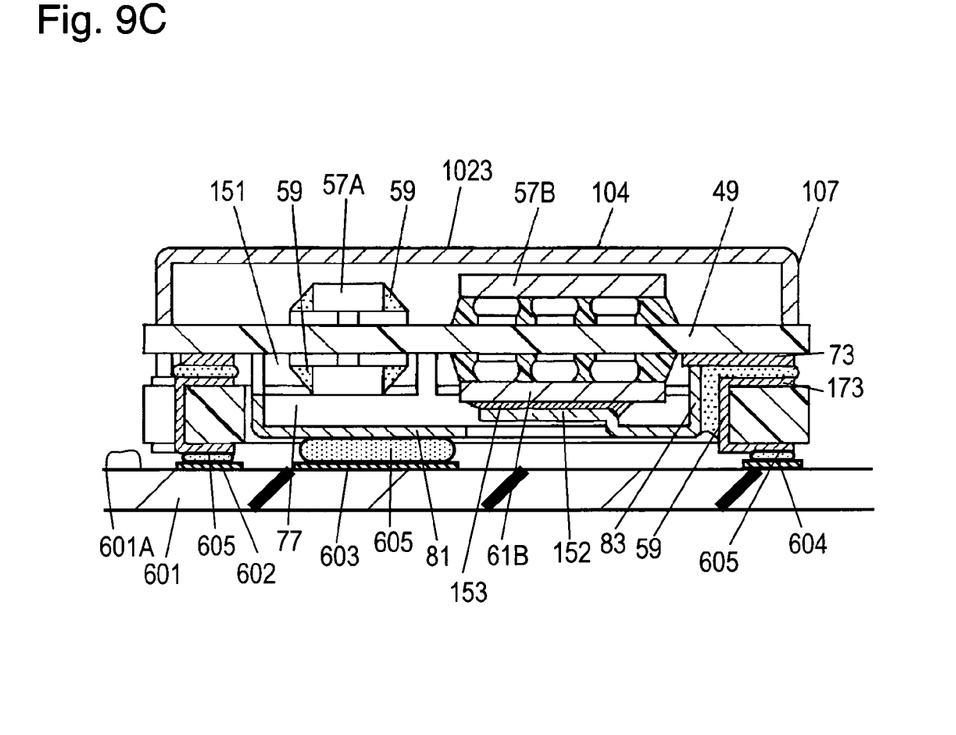
FIG. 9C is a sectional view of the module shown in FIG. 9A mounted onto a mother board.

FIG. 9C is a sectional view of module 1023 mounted onto mother board 601. Circuit patterns 602, 603 and 604 are provided on upper surface 601A of mother board 601. Cover 77 is soldered to circuit pattern 603 on mother board 601 with solder 605 in a reflow furnace. Solder 605 has a melting point lower than that of solder 59. Solder 59 does not melt when module 23 is mounted onto mother board 601 and does not cause a short circuit.

Grease 153 applied between IC element 61B and projection 152 of cover 77 transmits heat generated by IC element 61B to cover 77. Cover 77 soldered onto mother board 601 then dissipates the heat of IC element 61B through mother board 601.

Notches 111 and 113 are formed adjacent to connection conductor 87. Connection conductor 87 is connected electrically to conductor 113B of notch 113 via conductor pattern 113C. The heat generated by IC element 61B is transmitted through cover 77, solder 59, and connection conductor 87 and also through notches 111 and 113, and is dissipated from cover 104 via legs 109. This heat dissipation allows components generating heat to be used as the electronic components mounted onto lower surface 53 of circuit board 49, thereby providing high-frequency module 1023 having a small size.

Modules 23 and 1023 according to this embodiment increase the density of components mounted on mother boards 501 and 601, and are useful in portable apparatuses having small sizes.

What is claimed is:

1. A module comprising:
   a circuit board having an upper surface and a lower surface;
   a first terminal provided on the lower surface of the circuit board;
   a first electronic component mounted onto the upper surface of the circuit board;
   a first cover made of metal covering the first electronic component;
   a second electronic component mounted onto the lower surface of the circuit board;
   a terminal board provided under the lower surface of the circuit board, the terminal board having a lower surface and an upper surface, the upper surface of the terminal board facing the lower surface of the circuit board;
   a second terminal provided on the upper surface of the terminal board, the second terminal facing the first terminal, the second terminal being connected to the first terminal;
   a third terminal provided on the lower surface of the terminal board, the third terminal being connected to the second terminal; and a second cover made of metal covering the second electronic component, wherein the terminal board has an opening therein penetrating from the upper surface of the terminal board to the lower surface of the terminal board, the opening having an inner periphery surrounding the second electronic component, and the second cover includes a top plate portion located under the second electronic component, and a side plate portion extending from the top plate portion toward the lower surface of the circuit board, the side plate portion being positioned between the second electronic component and the inner periphery of the opening.

2. The module of claim 1, further comprising:

a connection conductor provided on the inner periphery of the opening, and a bonding material filling a space between the connection conductor and the side plate portion of the second cover, the bonding material fixing the second cover to the terminal board.

3. The module of claim 1, further comprising an insulation film provided on an outer surface of the top plate portion of the second cover.

4. The module of claim 1, further comprising an insulation film provided on an inner surface of the top plate portion of the second cover.

5. The module of claim 1, wherein the lower surface of the terminal board protrudes beyond the top plate portion of the second cover.

6. The module of claim 1, wherein the first cover has a leg extending toward the upper surface of the circuit board, and the circuit board has a first notch in which the leg is inserted.

7. The module of claim 6, wherein the leg is connected to the first notch.

8. The module of claim 6, wherein the leg has a chamfered surface facing the circuit board.

9. The module of claim 6, wherein the terminal board has a second notch in which the leg is inserted.

10. The module of claim 9, wherein the leg is connected to the second notch.

11. The module of claim 9, wherein a first gap is provided between the leg and the second notch, and a second gap larger than the first gap is provided between the leg and the first notch.

12. The module of claim 9, wherein a first gap is provided between the leg and the second notch, and a second gap smaller than the first gap is provided between the leg and the first notch.

13. The module of claim 1, wherein the side plate portion contacts on the lower surface of the circuit board.

14. The module of claim 1, wherein the terminal board has an outer side surface, and the circuit board has an outer surface flush with the outer side surface of the terminal board.

15. The module of claim 1, further comprising a heat conductive material provided between the second electronic component and the top plate portion of the second cover, the heat conductive material contacting the second electronic component and the top plate portion.

16. The module of claim 15, wherein the heat conductive material comprises grease.

17. The module of claim 15, wherein the second cover has a projection projecting from the top plate portion toward the second electronic component, the projection contacting the heat conductive material.

18. The module of claim 1, a gap is provided between an edge of the side plate portion of the second cover and the lower surface of the circuit board.

19. The module of claim 1, further comprising a heat conductive material provided between the side plate portion of the second cover and the terminal board, the heat conductive material contacting the side plate portion and the terminal board.

20. The module of claim 19, further comprising a connection conductor provided on the inner periphery of the opening, wherein the heat conductive material fills a gap between the connection conductor and the side plate portion of the second cover, and the heat conductive material contacts the connection conductor and the side plate portion.

21. The module of claim 20, wherein the heat conductive material comprises a solder.

22. The module of claim 1, wherein the first cover has a leg extending toward the upper surface of the circuit board, and the terminal board has a notch in which the leg is inserted, said module further comprising:

a conductor provided on the notch; and a heat conductive material connecting the leg to the conductor.

23. The module of claim 22, further comprising:

a connection conductor provided on the inner periphery of the opening; and a conductor pattern connecting the conductor and the connection conductor.

24. The module of claim 22, wherein the leg is connected to the notch.

25. An electronic apparatus comprising:

a circuit board having an upper surface and a lower surface;

a first terminal provided on the lower surface of the circuit board;

a first electronic component mounted onto the upper surface of the circuit board;

a first cover made of metal covering the first electronic component;

a second electronic component mounted onto the lower surface of the circuit board;

a terminal board provided under the lower surface of the circuit board, the terminal board having a lower surface and an upper surface, the upper surface of the terminal board facing the lower surface of the circuit board;

a second terminal provided on the upper surface of the terminal board, the second terminal facing the first terminal, the second terminal being connected to the first terminal;

a third terminal provided on the lower surface of the terminal board, the third terminal being connected to the second terminal;

a second cover made of metal covering the second electronic component, wherein the terminal board has an opening therein penetrating from the upper surface of the terminal board to the lower surface of the terminal board, the opening having an inner periphery surrounding the second electronic component, and the second cover includes a top plate portion located under the second electronic component, and a side plate portion extending from the top plate portion toward the lower surface of the circuit board, the side plate portion being positioned between the second electronic component and the inner periphery of the opening;

a heat conductive material provided between the second electronic component and the top plate portion of the second cover, the heat conductive material contacting the second electronic component and the top plate portion;

a mother board; and a circuit pattern provided on the mother board and connected with the top plate portion of the second cover.

26. The electronic apparatus of claim 25, further comprising a first solder connecting the top plate portion of the second cover with the circuit pattern.

27. The electronic apparatus of claim 26, further comprising a second solder connecting the side plate portion of the second cover to the terminal board, the second solder having a melting point higher than a melting point of the first solder.

28. A method of manufacturing a module, comprising:

mounting a first electronic component onto an upper surface of a sheet substrate having a plurality of circuit boards joined to each other;

mounting a second electronic component on a lower surface of the sheet substrate;

mounting a terminal board having an opening to the lower surface of the sheet substrate so that the opening surrounds the second electronic component;

mounting a first cover made of metal covering the first electronic component after said mounting the first electronic component;

mounting a second cover made of metal covering the second electronic component after said mounting the second electronic component and after said mounting the terminal board;

connecting the mounted first cover to one of the circuit board and the terminal board with a first bonding material;

connecting the mounted second cover to the terminal board with a second bonding material; and dividing the sheet substrate into the plurality of circuit boards after said mounting the first electronic component, after said mounting the second electronic component, and after said mounting the terminal board.

29. The method of claim 28, wherein the first bonding material and the second bonding material comprise cream solder, said connecting the mounted first cover to the one of the circuit board and the terminal board with the first bonding material comprises connecting the mounted first cover to the one of the circuit board and the terminal board with the first bonding material in a reflow furnace; and said connecting the mounted second cover to the terminal board with the second bonding material comprises connecting the mounted second cover to the terminal board with the second bonding material in the reflow furnace simultaneously to said connecting the mounted first cover to the one of the circuit board and the terminal board with the first bonding material in the reflow furnace.

30. The method of claim 28, wherein the first bonding material and the second bonding material comprise cream solder, said connecting the mounted first cover to the one of the circuit board and the terminal board with the first bonding material comprises applying the first bonding material from a lower surface of the terminal board; and said connecting the mounted second cover to the terminal board with the second bonding material comprises applying the second bonding material from the lower surface of the terminal board.

31. The method of claim 28, further comprising cutting the terminal board simultaneously to said dividing the sheet substrate.

32. The method of claim 31, wherein said cutting the terminal board simultaneously to said dividing the sheet substrate comprises cutting the sheet substrate and the terminal board simultaneously so that a cut surface of the sheet substrate is flush with a cut surface of the terminal board.

33. The method of claim 32, wherein said cutting the sheet substrate and the terminal board simultaneously comprises cutting the sheet substrate and the terminal board simultaneously with a cutter blade.

34. The method of claim 28, wherein said dividing the sheet substrate is executed after said mounting the first cover and after said mounting the second cover.

35. The method of claim 28, wherein said dividing the sheet substrate is executed before said mounting the first cover and before said mounting the second cover.

* * * * *